United States Patent [19]

Hanaoka et al.

[11] Patent Number: 4,982,245
[45] Date of Patent: Jan. 1, 1991

[54] COMPOUND DIODE ASSEMBLY OF REDUCED LEAKAGE CURRENT

[75] Inventors: Masayuki Hanaoka, Fujimi; Hisanaga Takano, Kawaguchi, both of Japan

[73] Assignee: Sanken Electric Co., Ltd., Saitama, Japan

[21] Appl. No.: 445,459

[22] Filed: Dec. 4, 1989

[30] Foreign Application Priority Data

Dec. 9, 1988 [JP] Japan .................................. 63-311067

[51] Int. Cl.$^5$ .................. H01L 29/480; H01L 29/00; H01L 27/20; H01L 29/340
[52] U.S. Cl. ........................................ 357/15; 357/33; 357/46; 357/52
[58] Field of Search .................. 307/380, 451; 357/20, 357/42, 15, 13, 23.4, 56, 52, 33, 37, 48, 21, 46

[56] References Cited

U.S. PATENT DOCUMENTS

| | | | |
|---|---|---|---|
| 4,071,852 | 1/1978 | Kannam | 357/13 |
| 4,110,775 | 8/1978 | Festa | 357/15 |
| 4,158,206 | 6/1979 | Neilson | 357/13 |

FOREIGN PATENT DOCUMENTS 62-204357 12/1987 Japan .

Primary Examiner—Rolf Hille
Assistant Examiner—Peter Toby Brown
Attorney, Agent, or Firm—Woodcock Washburn Kurtz Mackiewicz & Norris

[57] ABSTRACT

A twin diode assembly is disclosed which has a pair of pn-junction diodes formed on a single semiconductor substrate to provide a common cathode. In order to reduce the flow of leakage current from one diode to the other through the common substrate, a semiconductor region of a specified conductivity type is formed in the substrate so as to provide a portion intervening between the pair of diodes. This intervening region efficiently collects the minority carriers diffusing from one diode toward the other when either of the two pn-junctions is forward biased.

9 Claims, 4 Drawing Sheets

COMPOUND DIODE ASSEMBLY OF REDUCED LEAKAGE CURRENT

BACKGROUND OF THE INVENTION

Our invention relates to a compound diode assembly generally known as a twin— or dual-diode assembly having two or more diode elements formed on a common semiconductor substrate to provide a common cathode. More particularly, our invention deals with means in such diode assemblies for the reduction of leakage current from one diode element to the other.

The common-cathode twinassembly has been known (FIG. 1) and used for rectification or for rectification and ripple filtration in switching regulators. The twin diode assembly has two pn-junction diodes, or Schottky-barrier diodes having guard rings, formed on a common semiconductor substrate having a cathode common to both diodes. As heretofore constructed, the twin diode assembly has been susceptible to the flow of leakage current from either diode to the other, with the consequent power loss. The leakage current is such that when the first diode of the twin diode assembly is forward-biased, for example, and the second reverse-biased, then a substantial proportion of the anode current of the first diode tends to flow to the anode of the nonconducting second diode instead of to the common cathode. We will later discuss why such leakage current flows in the twin diode assembly of conventional make.

We cite Japanese Unexamined Utility Model Publication No. 62-204357, laid open to public inspection on Dec. 26, 1987, as a known attempt at the reduction of the leakage current. This attempt, however, has met with only a limited success. There have been consistent demands in the electronics industry for twin diode assemblies that are far more free from leakage current and, therefore, from power loss.

SUMMARY OF THE INVENTION

We have hereby invented how to reduce the flow of leakage current in compound diode assemblies to an extent that has been heretofore unattainable.

Briefly, our invention may be summarized as a compound diode assembly comprising a substrate having a first and a second main face opposite to each other. The substrate comprises a first semiconductor region of a first conductivity type providing the first main face of the substrate, and a second semiconductor region of the first conductivity type providing the second main face of the substrate and formed contiguous to the first semiconductor region, the second semiconductor region being higher in impurity concentration than the first semiconductor region. The substrate further comprises a third and a fourth semiconductor region of a second conductivity type, opposite to the first conductivity type, formed in the first main face of the substrate and providing a first and a second pn junction at their interfaces with the first semiconductor region. Furthermore, in accordance with features of our invention, the substrate has a fifth semiconductor region of the second conductivity type formed in the first main face of the substrate and disposed at least intermediate the third and fourth semiconductor regions, and at least one sixth semiconductor region of the first conductivity type also formed in the first main face of the substrate and being higher in impurity concentration than the first semiconductor region;

Additionally, the compound diode assembly of our invention comprises a first electrode electrically connected to the third semiconductor region, a second electrode electrically connected to the fourth semiconductor region, a third electrode electrically connected to the second semiconductor region, and a fourth electrode electrically interconnecting the fifth and sixth semiconductor regions.

Perhaps the most pronounced feature of the compound diode assembly summarized above is the fifth semiconductor region of the substrate which is disposed at least intermediate the third and fourth semiconductor regions. The third, fourth and fifth semiconductor regions are all of the same conductivity type. The fifth semiconductor region functions to collect the minority carriers that have been injected into the first semiconductor region from either the third or fourth semiconductor region and which have been diffusing toward the other of the third and fourth semiconductor regions to cause current leakage.

The collection of the undesired minority carriers by the fifth semiconductor region takes place as this region serves as the collector of either of two parasitic transistors created within the substrate depending upon the biasing directions of the two pn junctions formed at the interfaces between the first semiconductor region and the third and fourth semiconductor regions. One of the parasitic transistors additionally comprises the third semiconductor region as the emitter and the first semiconductor region as the base. The other parasitic transistor additionally comprises the fourth semiconductor region as the emitter and the first semiconductor region as the base.

As set forth in the foregoing summary, the fifth semiconductor region is electrically connected to the sixth semiconductor region via the fourth electrode. Accordingly, the current due to the minority carriers that have been captured by the fifth semiconductor region flows through a path comprising the fourth electrode, sixth semiconductor region, the second semiconductor region and the third electrode (cathode). The current forms part of the forward current of the diode including the pn junction that is forward biased.

We have thus succeeded in drastically reducing the leakage current due to the minority carriers tending to flow from the forward baised pn junction toward the reverse biased pn junction. Our invention is applicable not only to the compound pn-junction diode assembly but also to a compound Schottky-barrier diode assembly having guard rings, as will be disclosed herein.

The above and other features and advantages of our invention and the manner of realizing them will become more apparent, and the invention itself will best be understood, from a study of the following description and appended claims, with reference had to the attached drawings showing some preferable embodiments of our invention.

DETAILED DESCRIPTION OF THE INVENTION

Figure 1:
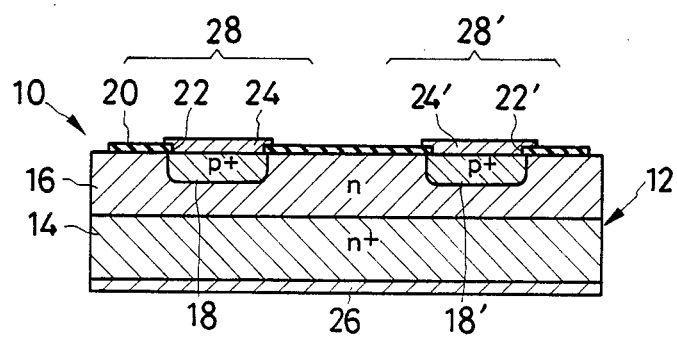
FIG. 1 is a section through the prior art twin pn-junction diode assembly.

We will describe the prior art twin diode assembly in some more detail in order to make clearer the problem of leakage current arising herewith. Generally designated 10 in FIG. 1, the prior art twin diode assembly has a semiconductor substrate 12. The substrate 12 has an $n^+$-type region 14, formed by the start semiconductor material, and n-type region 16 grown epitaxially in the $n^+$-type start material. Additionally, a pair of insular $p^+$-type regions 18 and 18' are formed in the n-type region 16. It will be seen that, being generally flat in shape, the semiconductor substrate 12 has a pair of opposite main faces, with the pair of insular $p^+$-type regions 18 and 18' exposed at one of the main faces that is shown directed upwardly. Hereinafter, in this specification, we will refer to this main face of the substrate as the top face, and to the other main face as the bottom face.

The top face of the substrate 12 is covered with a protective layer 20 which is apertured at 22 and 22' to expose the $p^+$-type regions 18 and 18'. Formed on the protective layer 20 are a pair of anodes 24 and 24' which are in low-resistance contact with the exposed $p^+$-type regions 18 and 18' through the apertures 22 and 22', respectively. A cathode 26 is formed on the bottom face of the semiconductor substrate 12 in low-resistance contact with the $n^+$-type region 14.

The prior art twin diode assembly 10 has a first pn-junction diode 28 comprised of the anode 24, $p^+$-type region 18, n-type region 16, $n^+$-type region 14 and cathode 26. A second pn-junction diode 28' is comprised of the anode 24', $p^+$-type region 18', n-type region 16, $n^+$-type region 14 and cathode 26. The two pn-junction diodes 28 and 28' are akin in electrical characteristics as their $p^+$-type regions 18 and 18' are of approximately the same impurity concentration and diffusion depth.

In use of the prior art twin diode assembly 10 for rectification and ripple filtration in a switching regulator, for example, either of the two pn-junction diodes 28 and 28' is forward-biased whereas the other is reverse-biased. Let us assume that the first diode 28 is forward-baised and the other is reverse-biased. Then, as the first diode 28 is conductive and the other 28' nonconductive, not all the anode current of the first diode 28 flows as the forward current to the cathode 26; instead, part of the current flows to the anode 24' of the nonconducting second diode 28'. This is a leakage current serving no purpose at all, causing only power loss.

The following is our explanation of the leakage current (reverse current) flowing to the second diode 28' in the prior art twin diode assembly 10. The application of a forward bias voltage to the first diode 28 results in the injection of holes, minority carriers, from $p^+$-type region 18 into n-type region 16. The majority of the holes diffuse down through the n-type region 16 toward the $n^+$-type region 14, forming the forward current of the first diode 28. The remaining holes, however, diffuse laterally through the n-type region 16 toward the $p^+$-type region 18' of the second diode 28'. What is important in conjunction with such lateral diffusion of the holes is that the prior art twin diode assembly 10 has a parasitic pnp transistor created by the two $p^+$-type regions 18 and 18' and the intervening n-type region 16. The first $p^+$-type region 18 forms the emitter of the parasitic transistor, the n-type region 16 its base, and the second $p^+$-type region 18' its collector. Accordingly, although most of the holes diffusing laterally through the n-type region 16 recombine with the electrons injected form the $n^+$-type region 14, some of them collect at the second $p^+$-type region 18' as the collector current of the parasitic transistor. It is this collector current of the parasitic transistor that forms the leakalge current flowing to the anode 24' of the nonconducting second diode 28'.

An obvious remedy to this problem might be to provide a sufficiently large spacing between the two $p^+$-type regions 18 and 18' to prevent the flow of the leakage current. This remedy is unrealistic as it would make the size of the semiconductor substrate 12, and therefore of the complete twin diode assembly 10, inconveniently large.

The above cited Japanese Unexamined Utility Model Publication No. 62-204357 proposes to provide an additional $n^+$-type region in the n-type region 16 so as to intervene between the two $p^+$-type regions 18 and 18'. The additional $n^+$-type region serves the purpose of reducting the current amplification factor of the parasitic transistor. The resulting reduction of the leakage current has been unsatisfactory.

First Form

A first preferred form of twin diode assembly according to our invention is illustrated in FIGS. 2-5 and therein generally designated 30. This twin diode assembly 30, as well as additional embodiments of our invention to be disclosed subsequently, include parts corresponding to those of the prior art device 10 of FIG. 1. We will therefore identify such conventional parts of the embodiments of our invention by the same reference characters used to denote the corresponding parts of the prior art device 10 and will omit any repeated description of such conventional parts.

Figure 2:
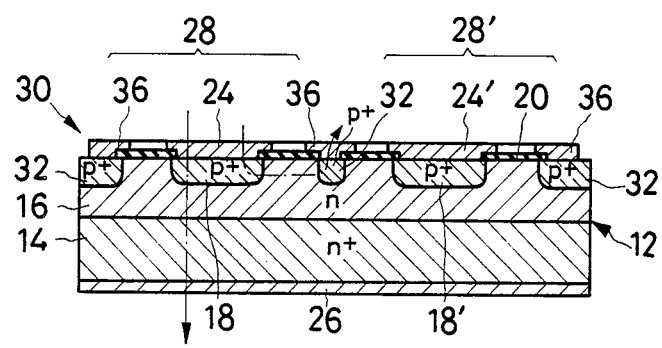
FIG. 2 is a section through the twin pn-junction diode assembly constructed in accordance with the novel concepts of our invention, the section being taken along the line II—II in FIG. 5.
Figure 3:
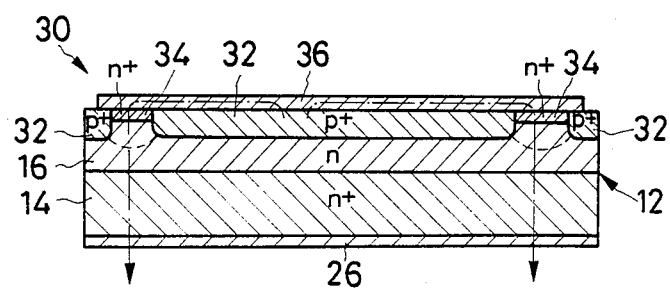
FIG. 3 is another section through the twin diode assembly of FIG. 2, taken along the line III—III in FIG. 5.

As will be best understood from a comparison of FIGS. 1 and 2, the twin diode assembly 30 of our invention is analogous with the prior art device 10 having the pair of pn-junction diodes 28 and 28'. The first diode 28 comprises the anode 24, $p^+$-type region 18, n-type region 16, $n^+$-type region 14 and cathode 26. The second diode 28' likewise comprises the anode 24', $p^+$-type region 18', n-type region 16, $n^+$-type region 14 and cathode 26.

Figure 4:
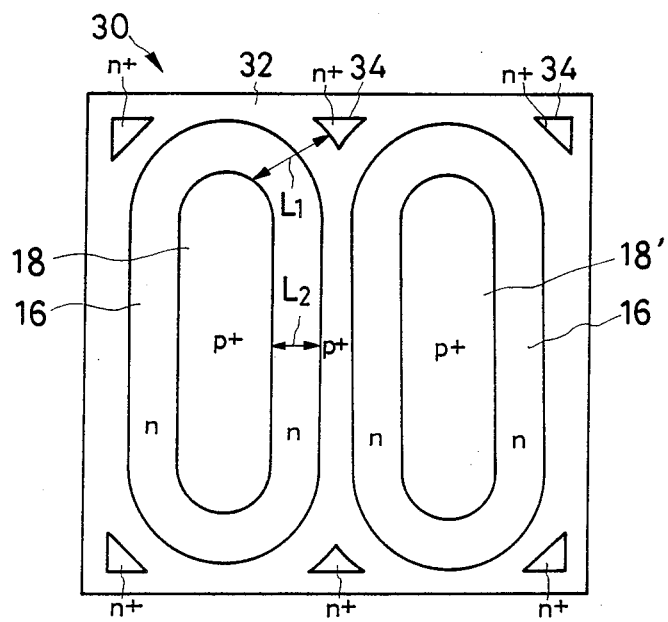
FIG. 4 is a top plan of the semiconductor substrate of the twin diode assembly of FIGS. 2 and 3.
Figure 5:
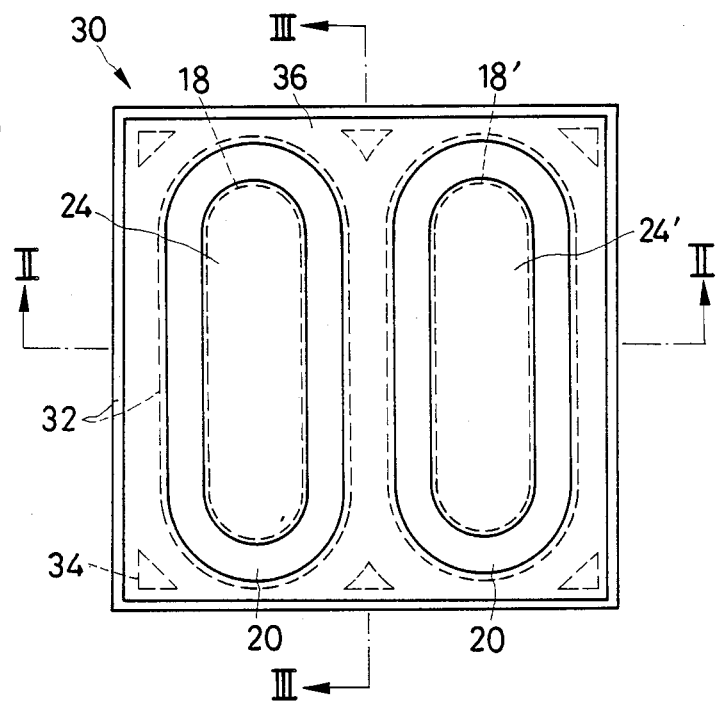
FIG. 5 is a top plan of the twin diode assembly of FIGS. 2 and 3.

The twin diode assembly 30 features a $p^+$-type antileakage region 32 formed in the n-type region 16 so as to be exposed at the top face of the semiconductor substrate 12. FIG. 4 in particular clearly illustrates that the $p^+$-type antileakage region 32 is approximately in the shape of the digit "8" as seen in a plan view as in this figure. The two circles of the 8-shaped p+-type antileakage region 32 surround the respective p+-type regions 18 and 18' of the diodes 28 and 28' via parts of the n-type region 16. Another feature is one or more, six in this embodiment, n+-type insular regions 34, FIGS. 3 and 4, formed also in the top face of the n-type region 16 for ohmic contact with an electrode to be set forth subsequently.

Theoretically, the p+-type antileakage region 32 may be provided only between the two p+-type diode regions 18 and 18' solely for the purpose of reducing leakage current. We nevertheless recommend the illustrated 8-shaped form of the antileakage region 32, individually surrounding the p+-type diode regions 18 and 18', as this form contributes to the enhancement of the reverse voltage-blocking capabilities of the pn-junctions of the diodes 28 and 28'. The p+-type antileakage region 32 can be formed by diffusion at the same time with the p+-type diode regions 18 and 18'. Therefore, like the p+-type diode regions 18 and 18', the antileakage region 32 has a depth terminating short of the n+-type region 14.

As best pictured in FIG. 4, the n+-type insular ohmic-contact regions 34 are all distanced away from the area between the pair of p+-type diode regions 18 and 18'. Exposed at the top face of the substrate 12, the n+-type ohmic-contact regions 34 are shown to be shallower than the p+-type antileakage region 32, having a bottom face contiguous to the n-type region 16. The impurity concentration of the n−-type ohmic-contact regions 34 is higher than that of the n-type region 16.

The twin diode assembly 30 further comprises an electrode 36 formed on the top face of the semiconductor substrate 12 for low-resistance contact with both p+-type antileakage region 32 and n−-type contact region 34. the electrode 36 is apertured to avoide contact with the anodes 24 and 24' of the diodes 28 and 28'. The electrode 36 can be formed concurrently with the anodes 24 and 24'.

Operation of First Form

Assume for example that such voltages are impressed between first anode 24 and cathode 26, and between second anode 24' and cathode 26, as to establish a positive potential at the first anode and a negative potential at the second anode. Then the first pn-junction diode 28 will become conductive, and the second pn-junction diode 28' nonconductive. We have stated in connection with FIG. 1 that a leakage current flowed under these conditions from first to second anode in the prior art device 10. The improved twin diode assembly 30 of our invention realizes a drastic curtailment of the leakage current. We may explain this effect of leakage current reduction in accordance with our invention as follows:

The application of a forward bias voltage to the first pn-junction diode 28 results in the injection of holes (minority carriers) from first p+-type diode region 18 into common n-type substrate region 16. As in the prior art, most of the holes diffuse down toward the common cathode 26, and the rest of them diffuse transversely through the n-type substrate region 16. However, unlike the prior art, the holes traveling transversely through the n-type substrate region 16 collect at the p+-type antileakage region 32 before arriving at the second p+-type diode region 18'.

The collection of the stray holes at the p+-type antileakage region 32 is because this antileakage region functions as the collector of a parasitic pnp transistor additionally comprising the first p+-type diode region 18 as the emitter and the n-type substrate region 16 as the base. The transistor action due to the three regions 16, 18 and 32, or 16, 18' and 32, takes place for the following reasons:

The n+-type insular regions 34 are higher in impurity concentration, and lower in resistivity, than the n-type substrate region 16. Moreover, although formed to a relatively shallow depth from the top face of the semiconductor substrate 12, the n+-type insular regions 34 have their bottoms disposed closer to the cathode 26 than is the top face of the n-type substrate region 16. The potential of the n+-type insular regions 34 with respect to that of the cathode 26 is therefore lower than the surface potential of the n-type substrate region 16. The potential of the n+-type insular regions 34 grows less from its top toward its bottom. Should these n+-type regions 34 be in contact with the n+-type substrate region 14, their potential would be approximately equal to that of the cathode 26. Also, the potential of the n+-type regions 34 grows less with an increase in their minimum distance $L_1$ (FIG. 4), from either of the p+-type diode regions 18 and 18'. This is because the resistance between the first anode 24, for example, and each n+-type region 34 increases with an increase in the distance $L_1$, resulting in a decrease in the potential of the n+-type regions 34. The potential of the n+-type regions 34 becomes less than that part of the n-type region 16 which adjoins p+-type region 32 if the distance $L_1$ is made longer than the minimum distance $L_2$ (FIG. 4) between the p+-type region 32 and either of the p+-type diode regions 18 and 18'.

The p+-type antileakage region 32 is electrically connected to the n+-type regions 34 via the overlying electrode 36. The potential of the p+-type antileakage region 32 can therefore be considered equal to that of the n+-type regions 34. Thus, since the potential of the n+-type regions 34 is less than that of the n-type substrate region 16 as aforesaid, it follows that the potential of the p+-type antileakage region 32 is less than that of the n-type substrate region 16. Consequently, the pn junction between these regions is reverse-biased.

It is thus seen that the first parasitic pnp transistor is created whose emitter is the first p+-type diode region 18, whose base is the n-type substrate region 16, and whose collector is the p+-type antileakage region 32. The collector (p+-type antileakage region 32) of this first parasitic transistor functions to collect the holes diffusing transversely through the n-type substrate region 16 after having been injected from the first p+-type diode region 18, thus preventing the holes from flowing into the second p+-type diode region 18'.

Collected as above by the p+-type antileakage region 32, the holes provide the collector current for the first parasitic transistor. The collector current flows on to the electrode 36 and thence, via the n+-type regions 34, n-type region 16 and n+-type region 14, to the cathode 26 which is at the lowest potential. This current can be considered part of the forward current of the first pn-junction diode 28 as it flows from first anode 24 to cathode 26, doing no harm to the efficiency of rectification.

It is self-evident from the foregoing description that the same process of leakage current reduction takes place when the first pn-junction diode 28 is reverse biased, and the second pn-junction diode 28' forward biased. A second parasitic pnp transistor functions in this case, preventing the flow of the leakage current from second p+-type diode region 18' to first pn-junction diode 28. The emitter of this second parasitic transistor is the second p+-type diode region 18', its base is the n-type substrate region 16, and its collector is the p+-type antileakage region 32.

Second Form

Figure 6:
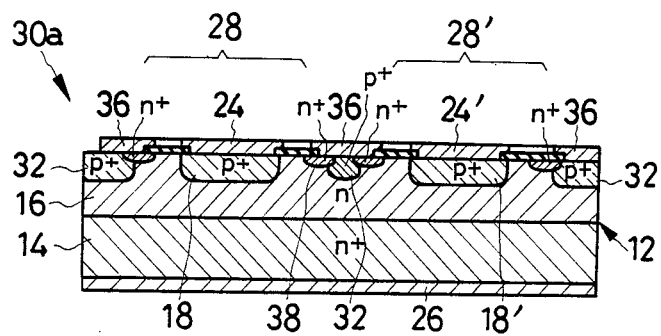
FIG. 6 is a section through another preferred form of twin pn-junction diode assembly in accordance with our invention, the section being taken along the line VI—VI in FIG. 7.
Figure 7:
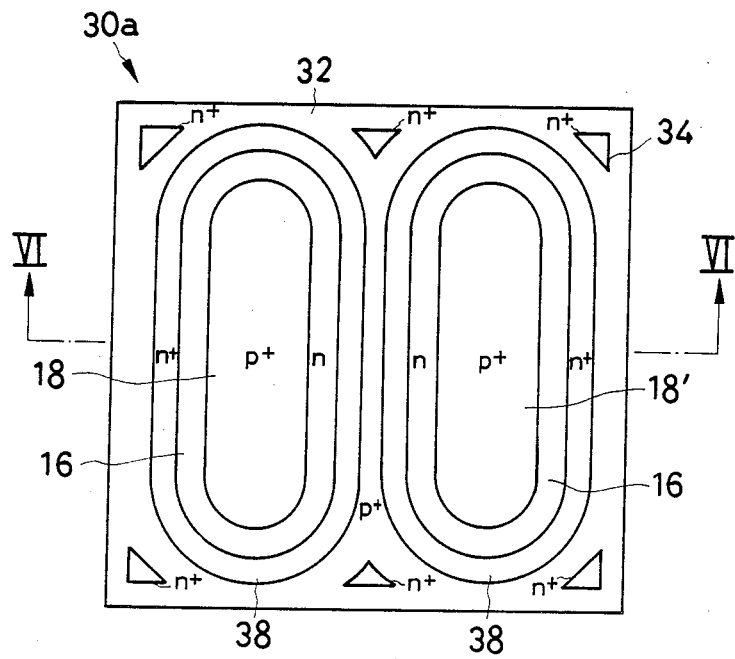
FIG. 7 is a top plan of the semiconductor substrate of the twin diode assembly of FIG. 6.

We have illustrated the second preferred form of twin diode assembly 30a in FIGS. 6 and 7. This twin diode assembly 30a features a pair of n+-type regions 38 formed in the n-type region 16 of the substrate 12 so as to be exposed at its top face. As seen in a vertical section as in FIG. 6, the n+-type regions 38 have portions disposed on both sides of the central portion of the 8-shaped p+-type antileakage region 32. As seen in a plan view as in FIG. 7, the n+-type regions 38 are annular in shape, individually surrounding the respective p+-type diode regions 18 and 18' via parts of the n-type substrate region 16. The n+-type regions 38 can be formed by diffusion at the same time with the n+-type insular regions 34. This second twin diode assembly 30a can be analogous with the FIGS. 2-5 twin diode assembly 30 in the other details of construction.

Operation of Second Form

In this second twin diode assembly 30a, too, a first parasitic pnp transistor is created when the first pn-junction diode 28 is forward biased, and the second pn-junction diode 28' reverse biased. The emitter of the first parasitic transistor is the first p+-type diode region 18, its base is the n-type substrate region 16 and n+-type regions 38, and its collector is the p+-type antileakage region 32. The first parasitic transistor functions as in the foregoing embodiments to reduce the leakage current flowing from the first p+-type diode region 18 toward the second p+-type diode region 18'.

A second parasitic pnp transistor is likewise created when the first pn-junction diode 28 is reverse-biased, and the second pn-junction diode 28' forward-biased. The emitter of this second parasitic transistor is the second p+-type diode region 18', its base is the n-type substrate region 16 and n+-type regions 38, and its collector is the p+-type antileakage region 32. The second parasitic transistor functions to reduce the leakage current flowing from the second p+-type diode region 18' toward the first p+-type diode region 18.

Functionally, this twin diode assembly 30a features the prevention of the punch-through by the n+-type regions 38 of higher impurity concentration than the n-type substrate region 16. Suppose for example that a positive voltage is impressed to the first anode 24, and a negative voltage to the cathode 26 and second anode 24'. Since the second pn-junction diode 28' is now reverse-biased, a depletion layer is created along and on both sides of the pn-junction between second p+-type diode region 18' and n-type substrate region 16. This depletion layer is a greater extent in the n-type substrate region 16 by reason of its lower impurity concentration. The spreading of the depletion layer is limited, however, by the n+-type regions 38 of high impurity concentration, with the consequent prevention of the punch-through or the joining of the p+-type regions 18' and 32 by the depletion layer.

The avoidance of the punch-through in this twin diode assembly 30a is of great significance for the true prevention of leakage current. Should a punch-through take place, the minority carriers or holes collected by the p+-type antileakage region 32 would travel on to the second p+-type diode region 18' via the depletion layer, making it impossible to achieve the objective of leakage current prevention.

It might be contemplated to provide sufficiently large spacings between the p+-type diode regions 18 and 18' and the p+-type antileakage region 32 to prevent the punch-through. This solution is objectionable in consideration of the resulting increase in the size of the substrate 12 and, in consequence, of the complete twin diode assembly. The n+-type regions 38 serves to prevent the punch-through without adding to the size of the substrate 12.

The n+-type regions 38 characterizing the twin diode assembly 30a offer an additional advantage in connection with the known technique of diffusing what is referred to in the art as a lifetime killer, such as gold, into the substrate. This lifetime killer is intended to shorten the lifetime of the injected carriers and hence to improve the switching characteristic of the diode. The diffusion of the lifetime killer causes a decrease in the apparent impurity concentration of the n-type substrate region 16. Consequently, were it not for the n+-type regions 38 in accordance with our invention, the depletion layer would become easier to spread through the n-type substrate region 16.

In FIG. 6 we have shown the electrode 36 to be in overlapping relation with the n+-type regions 38. We prefer this arrangement because the potential of the electrode 36 serves to stabilize the potential of the n+-type regions 38. We could, however, form the electrode 36 and the n+-type regions 38 out of lapping relation with each other.

We recommend the electrical connection of the n+-type regions 38 to the electrode 36 for an additional reason, particularly when the n+-type regions 38 are far less in diffusion depth than the p+-type antileakage region 32 as in this embodiment. Although most of the minority carriers diffusing transversely through the n-type substrate region 16 collect at the p+-type antileakage region 32, the rest of them flow into the n+-type regions 38. If then the n+-type regions 38 are electrically connected to the electrode 36, the current due to the minority carriers that have entered the n+-type regions 38 will flow to the cathode 26 through the electrode 36, n+-type regions 34, n-type substrate region 16 and n+-type substrate region 14.

Third Form

Figure 8:
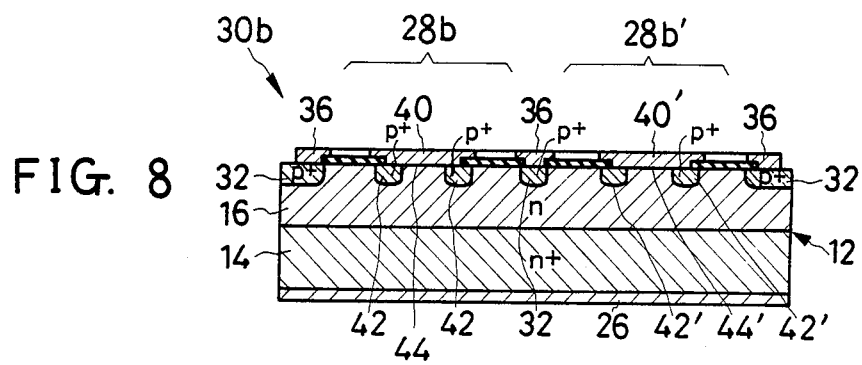
FIG. 8 is a section through a twin Schottky-barrier diode assembly embodying the principles of our invention, the section being taken along the line VIII—VIII in FIG. 9.
Figure 9:
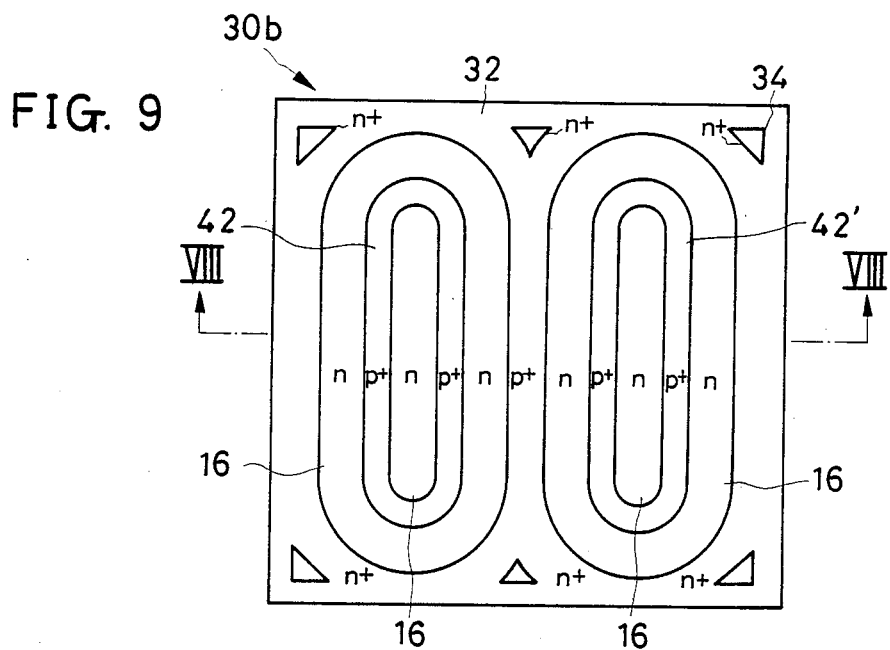
FIG. 9 is a top plan of the semiconductor substrate of the twin diode assembly of FIG. 8.

The third preferred form of twin diode assembly 30b shown in FIGS. 8 and 9 differs from the foregoing twin diode assemblies 30 and 30a in having a pair of Schottky-barrier diodes 28b and 28b' in lieu of the pn-junction diodes 28 and 28'. Both Schottky diodes 28b and 28b' share the n+-type region 14 and n-type region 16 of the substrate 12 and the cathode 26 as in the foregoing embodiments. Additionally, the first Schottky diode 28b comprises a first barrier electrode (anode) 40 formed on the n-type substrate region 16, and a first p+-type guard ring 42 formed around the first barrier electrode 40. The second Schottky diode 28b' additionally comprises a second barrier electrode 40' formed on the n-type substrate region 16, and a second p+-type guard ring 42' formed around the second barrier electrode 40'.

The first barrier electrode 40 contacts both n-type substrate region 16 and first p+-type guard ring 42. The second barrier electrode 40' contacts both n-type substrate region 16 and second p+-type guard ring 42'. The barrier electrodes 40 and 40' create Schottky barriers 44 and 44' at their interfaces with the n-type substrate region 16 but not with their interfaces with the guard rings 42 and 42'. These guard rings 42 and 42' surround the Schottky barriers 44 and 44', respectively, to serve their intended functions as the guard rings. Also, the p+-type guard rings 42 and 42' provide pn junctions with the n-type substrate region 16, thus forming pn-junction diodes.

The construction of the Schottky diodes 28b and 28b' as so far described in conventional. We have improved the twin-Schottky-diode assembly 30b by providing the 8-shaped p+-type antileakage region 32 formed in the n-type substrate region 16. As seen in a plan view of FIG. 9, the p+-type antileakage region 32 individually surrounds the p+-type guard rings 42 and 42' via the n-type substrate region 16. Exposed at the top face of the substrate 12, the p+-type antileakage region 32 makes low-resistance contact with the electrode 36 which is connected to the n+-type insular regions 34.

Operation of Third Form

In this twin-Schottky-diode assembly 30b, the injection of holes takes place from first p+-type guard ring 42 into common n-type substrate region 16 when the first Schottky diode 28b is forward-biased and the second Schottky diode 28b' reverse-biased. Some of the injected holes diffuse transversely through the n-type substrate region 16 as in the two foregoing twin diode assemblies 30 and 30a. If this twin diode assembly 30b were of prior art construction, the holes would collect at the second p+-type guard ring 42'.

However, in the illustrated construction of the twin diode assembly 30b, the transversely diffusing holes collect at the midportion of the p+-type antileakage region 32, and are so prevented from traveling on to the second p+-type guard ring 42', by virtue of the action of the first parasitic pnp transistor comprised of the first p+-type guard ring 42, n-type substrate region 16 and p+-type antileakage region 32.

Essentially the same process of leakage current prevention takes place when the first Schottky diode 28b is reverse-biased and the second Schottky diode 28b' forward-biased. The second parasitic pnp transistor created then is comprised of the second p+-type guard ring 42', n-type substrate region 16 and p+-type antileakage region 32.

Possible Modifications

Although we have shown and described the compound diode assembly of our invention in terms of several currently preferred forms thereof, we do not wish our invention to be limited by the exact details of such embodiments. The following, then, is a brief list of possible modifications or alterations of the illustrated embodiments which we believe all fall within the scope of our invention:

1. The p+-type antileakage region 32 of the FIGS. 2-5 twin diode assemblies 30 and of the FIGS. 6 and 7 twin diode assembly 30a may not necessarily completely encircle each of the pair of p+-type diode regions 18 and 18' as seen in a plan view as in FIGS. 4 or 7. The desired objective of leakage current reduction will be more or less attained only if the p+-type antileakage region 32 is provided between the p+-type diode regions 18 and 18'. In the FIGS. 8 and 9 twin diode assembly 30b, too, the p+-type antileakage region 32 may also be provided at least between the pair of p+-type diode regions 42 and 42'.

2. The annular n+-type regions 38 of the FIGS. 6 and 7 assembly 30a could be spaced from the p+-type antileakage region 32.

3. The n+-type insular regions 34 of all the illustrated twin diode assemblies 30, 30a and 30b could be disposed anywhere on the top face of the semiconductor substrate for contact with the electrode 36. However, for the purpose of leakage current reduction, the insular regions 34 may advantageously be spaced away from between the pair of p+-type diode regions 18 and 18', or 42 and 42'.

4. The n+-type insular regions 34 could be formed deeper than the p+-type antileakage region 32, as indicated by the broken lines in FIG. 3, or even into the n+-type substrate region 14.

What we claim is:

1. A compound diode assembly of reduced leakage current, comprising:
   (a) a substrate having a first and a second main face opposite to each other, the substrate comprising:
     (1) a first semiconductor region of a first conductivity type providing the first main face of the substrate;
     (2) a second semiconductor region of higher impurity concentration than the first semiconductor region providing the second main face of the substrate and formed contiguous to the first semiconductor region;
     (3) a third semiconductor region of a second conductivity type, formed in the first main face of the substrate, the first and third semiconductor regions providing a first pn junction therebetween;
     (4) a fourth semiconductor region of the second conductivity type formed in the first main face of the substrate and spaced from the third semiconductor region, the first and fourth semiconductor regions providing a second pn junction therebetween;
     (5) a fifth semiconductor region of the second conductivity type formed in the first main face of the substrate and disposed at least intermediate the third and fourth semiconductor regions; and
     (6) at least one sixth semiconductor region of the first conductivity type formed in the first main face of the substrate and being higher in impurity concentration than the first semiconductor region;
   (b) a first electrode electrically connected to the third semiconductor region;
   (c) a second electrode electrically connected to the fourth semiconductor region;
   (d) a third electrode electrically connected to the second semiconductor region; and
   (e) a fourth electrode electrically interconnecting the fifth and sixth semiconductor regions;
   (f) whereby when either the first or second pn junction if forward biased, some of the minority carriers that have been injected into the first semiconductor region from the third or fourth semiconductor region collect at the fifth semiconductor region, with the consequent flow of a current from the fifth semiconductor region to the third electrode through a path comprising the fourth eletrode, the sixth semiconductor region and the second semiconductor region.

2. The compound diode assembly of claim 1 wherein, at the first main face of the substrate, the third and fourth semiconductor regions are individually surrounded by the first semiconductor region and, via the first semiconductor region, by the fifth semiconductor region.

3. The compound diode assembly of claim 1 wherein the fifth semiconductor region is positioned midway between the third and fourth semiconductor regions, and wherein the sixth semiconductor region is so positioned on the first main face of the substrate that the minimum distance ($L_1$) between the sixth semiconductor region and the nearer of the third and fourth semiconductor regions is longer than the minimum distance ($L_2$) between the fifth semiconductor region and each of the third and fourth semiconductor regions.

4. The compound diode assembly of claim 1 wherein the fifth semiconductor region is approximately in the shape of the digit "8" as seen at the first main face of the substrate, including a portion disposed between the third and fourth semiconductor regions.

5. The compound diode assembly of claim 1 wherein the sixth semiconductor region is formed in the first main face of the substrate to a greater depth than is the fifth semiconductor region.

6. The compound diode assembly of claim 1 wherein the substrate further comprises a seventh semiconductor region of the first conductivity type and of higher impurity concentration than the first semiconductor region, the seventh semiconductor region being formed in the first main face of the substrate so as to be positioned between the third semiconductor region and the fifth semiconductor region and between the fourth semiconductor region and the fifth semiconductor region and to be spaced from the third and fourth semiconductor regions.

7. The compound diode assembly of claim 6 wherein the seventh semiconductor region is formed in the first main face of the substrate to a smaller depth than is the fifth semiconductor region.

8. The compound diode assembly of claim 6 wherein the fourth electrode is formed on the first main face of the substrate in lapping relation to the seventh semiconductor region.

9. A compound diode assembly of reduced leakage current, comprising:
  (a) a substrate having a first and a second main face opposite to each other, the substrate comprising:
    (1) a first semiconductor region of a first conductivity type providing the first main face of the substrate;
    (2) a second semiconductor region of higher impurity concentration than the first semiconductor region providing the second main face of the substrate and formed contiguous to the first semiconductor region;
    (3) a third semiconductor region of a second conductivity type, opposite to the first conductivity type, formed in the first main face of the substrate and surrounding a first part of the first semiconductor region at the first main face of the substrate, the first and third semiconductor regions providing a first pn junction therebetween;
    (4) a fourth semiconductor region of the second conductivity type formed in the first main face of the substrate and surrounding a second part of the first semiconductor region at the first main face of the substrate and spaced from the third semiconductor region, the first and fourth semiconductor regions providing a second pn junction therebetween;
    (5) a fifth semiconductor region of the second conductivity type formed in the first main face of the substrate and disposed at least intermediate the third and fourth semiconductor regions; and
    (6) at least one sixth semiconductor region of the first conductivity type formed in the first main face of the substrate and being higher in impurity concentration than the first semiconductor region;
  (b) a first electrode electrically connected to the third semiconductor region and formed contiguous to the first part of the first semiconductor region to provide a first Schottky barrier therebetween;
  (c) a second electrode electrically connected to the fourth semiconductor region and formed contiguous to the second part of the first semiconductor region to provide a second Schottky barrier therebetween;
  (d) a third electrode electrically connected to the second semiconductor region; and
  (e) a fourth electrode electrically interconnecting the fifth and sixth semiconductor regions;
  (f) whereby when either the first or second pn junction is forward-biased, some of the minority carriers that have been injected into the first semiconductor region from the third or fourth semiconductor regions collect at the fifth semiconductor region, with the consequent flow of a current from the fifth semiconductor region to the third electrode through a path comprising the fourth electrode, the sixth semiconductor region and the second semiconductor region.

* * * * *

UNITED STATES PATENT AND TRADEMARK OFFICE
CERTIFICATE OF CORRECTION

PATENT NO.  : 4,982,245
DATED       : 1/1/91
INVENTOR(S) : Hanaoka et al.

It is certified that error appears in the above-identified patent and that said Letters Patent is hereby corrected as shown below:

Col. 1, line 13 "twinassembly" should be --twin assembly--.

Col. 1, line 37- delete the period at end of line. It is not the end of a sentence.

Col. 3, line 62 - "baised" should be spelled --biased--.

Col. 4, line 21 - "form" should be --from--.
Col. 4, line 24 - "leakalge" should be --leakage--.

Col. 4, line 39 - "reducting" should be spelled --reducing--.

Col. 5, line 36 - "n -type" should be --n$^+$-type--.

Col. 5, line 37 - "the" should be capitalized --The-- to begin the new sentence.

Col. 5, line 37 - "avoide" should be spelled --avoid--.
Col. 7, line 58 - "a" should be --of --.
Col. 9, line 12 - The word "in" should be --is--.
Col. 10, line 60 - The word "if" should be --is--.

Signed and Sealed this

Eighth Day of December, 1992

Attest:

DOUGLAS B. COMER

Attesting Officer       Acting Commissioner of Patents and Trademarks